(12) United States Patent
Blanton et al.

(10) Patent No.: US 9,188,644 B1
(45) Date of Patent: Nov. 17, 2015

(54) LATENCY MEASUREMENT SYSTEM AND METHOD

(71) Applicant: The Boeing Company, Chicago, IL (US)

(72) Inventors: William Brendan Blanton, Wilmington, DE (US); Robert Crenshaw Allen, Voorhees, NJ (US); Thomas Alfred DuBois, Media, PA (US)

(73) Assignee: The Boeing Company, Chicago, IL (US)

( * ) Notice: Subject to any disclaimer, the term of this patent is extended or adjusted under 35 U.S.C. 154(b) by 430 days.

(21) Appl. No.: 13/665,993

(22) Filed: Nov. 1, 2012

Related U.S. Application Data

(63) Continuation-in-part of application No. 13/626,144, filed on Sep. 25, 2012.

(51) Int. Cl.
*G01R 31/3181* (2006.01)
*G01R 31/3193* (2006.01)

(52) U.S. Cl.
CPC ...... *G01R 31/31937* (2013.01); *G01R 31/3181* (2013.01)

(58) Field of Classification Search
None
See application file for complete search history.

(56) References Cited

U.S. PATENT DOCUMENTS

| | | | |
|---|---|---|---|
| 5,521,907 A | 5/1996 | Ennis, Jr. et al. | |
| 6,322,216 B1 | 11/2001 | Yee et al. | |
| 6,556,540 B1 | 4/2003 | Mawhinney et al. | |
| 6,697,097 B1 | 2/2004 | Parker et al. | |
| 7,680,545 B2 | 3/2010 | Gebert | |
| 7,693,082 B2 | 4/2010 | Wright | |
| 7,823,001 B2 | 10/2010 | Clavequin et al. | |
| 7,908,507 B2 | 3/2011 | Ogura | |
| 8,290,526 B2 | 10/2012 | Broadley et al. | |
| 8,334,716 B1 | 12/2012 | Davidson et al. | |
| 8,743,020 B1 | 6/2014 | Mazuk et al. | |
| 8,838,322 B1 | 9/2014 | Zhu et al. | |
| 8,838,863 B2 | 9/2014 | Henriksson et al. | |
| 8,898,687 B2 | 11/2014 | Hulten et al. | |

(Continued)

FOREIGN PATENT DOCUMENTS

JP 2005184749 A 7/2005
JP 2009171334 A 7/2009

OTHER PUBLICATIONS

European Patent Office, European Search Report, Application No. 13177299.8-1904, pp. 1-9, dated Dec. 17, 2013.

*Primary Examiner* — Jay Patel
*Assistant Examiner* — Neil Mikeska

(57) ABSTRACT

The present disclosure is directed to a system for, and method operating latency measurement including an event generation device that generates an initial event used to measure system latency. A component test system receives the event and in response outputs a test component output signal and a zero-latency indicator. An electronics system including a multifunction display unit receives the test component output signal and displays a visible element on the multifunction display unit. A camera generates a series of recorded images, where each recorded image contains an image of the zero-latency indicator and an image of the visible element. A processor then determines the system latency by determining a time difference in the series of recorded images between a representation of an occurrence of the event in the image of the zero-latency indicator and a representation of the occurrence of the event in the image of the visible element.

20 Claims, 11 Drawing Sheets

(56) References Cited

U.S. PATENT DOCUMENTS

| | | |
|---|---|---|
| 8,911,087 B2 | 12/2014 | Publicover et al. |
| 2003/0021241 A1 | 1/2003 | Dame et al. |
| 2003/0133031 A1 | 7/2003 | Moberg et al. |
| 2005/0275831 A1 | 12/2005 | Silver |
| 2005/0276460 A1* | 12/2005 | Silver .......................... 382/141 |
| 2007/0081094 A1 | 4/2007 | Ciudad et al. |
| 2007/0183493 A1 | 8/2007 | Kimpe |
| 2008/0259174 A1* | 10/2008 | Nagao ...................... 348/220.1 |
| 2008/0307307 A1 | 12/2008 | Ciudad et al. |
| 2008/0310676 A1 | 12/2008 | Silver |
| 2009/0279611 A1 | 11/2009 | Gao |
| 2009/0310672 A1 | 12/2009 | Rao et al. |
| 2010/0002893 A1 | 1/2010 | Theverapperuma et al. |
| 2010/0141762 A1 | 6/2010 | Siann et al. |
| 2010/0166065 A1 | 7/2010 | Perlman et al. |
| 2010/0167713 A1 | 7/2010 | Hoffman |
| 2011/0018959 A1* | 1/2011 | Friel et al. ................. 348/14.08 |
| 2011/0107220 A1 | 5/2011 | Perlman |
| 2011/0109644 A1 | 5/2011 | Geutskens |
| 2011/0219112 A1 | 9/2011 | Fagg et al. |
| 2012/0105473 A1 | 5/2012 | Bar-Zeev et al. |
| 2012/0144409 A1* | 6/2012 | Pham .............................. 725/13 |
| 2012/0281767 A1 | 11/2012 | Duenas et al. |
| 2012/0287288 A1* | 11/2012 | Steinberg et al. ............. 348/181 |
| 2012/0287289 A1 | 11/2012 | Steinberg et al. |
| 2013/0182104 A1 | 7/2013 | Mangold et al. |
| 2013/0188544 A1 | 7/2013 | Tiwari et al. |
| 2014/0036095 A1 | 2/2014 | Kaehler et al. |
| 2014/0075030 A1 | 3/2014 | Wang et al. |

* cited by examiner

LATENCY MEASUREMENT SYSTEM AND METHOD

CROSS-REFERENCE TO RELATED APPLICATIONS

This application is a continuation-in-part of co-pending U.S. patent application Ser. No. 13/626,144 filed on Sep. 25, 2012, entitled "LATENCY MEASUREMENT SYSTEM AND METHOD," which is expressly incorporated by reference in its entirety.

TECHNICAL FIELD

The field of the embodiments presented herein is directed toward a latency measurement system using a camera to capture end-to-end latency on operator displays that processes a series of recorded images to extract timing measurements.

BACKGROUND

Many graphical operator display systems have critical timeline/latency requirements in the field of avionics and vehicle system control. However, system latency measurements in response to meeting respective latency requirements are often difficult to verify and frequently involve internal trigger signals that only generally approximate end-to-end latency. Manual timing measurements of latency on an oscilloscope are prone to error and are awkward in obtaining statistical distributions of system latency.

Typically there is no method to measure end-to-end system latency on a variety of systems without perturbing the actual system operation. In addition, when these measurements were possible, they often required significant manual operations that are prone to error. Difficulties in measuring system latencies are caused by the limited ability to take large numbers of sequential timing measurements to form statistical distributions, the automated processing of sequential timing measurement to eliminate manual measurement error, the challenge to provide a non-evasive end-to-end measurement, and the relative inflexibility to measure a variety of avionic and vehicular components within electronics systems. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a latency measurement system includes an event generation device that generates an initial event used to measure system latency. A component test system receives the event and in response outputs a test component output signal and a zero-latency indicator. An electronics system including a multifunction display unit receives the test component output signal and displays a visible element on the multifunction display unit. A camera generates a series of recorded images, where each recorded image contains an image of the zero-latency indicator and an image of the visible element. A processor then determines the system latency by determining a time difference in the series of recorded images between a representation of an occurrence of the event in the image of the zero-latency indicator and a representation of the occurrence of the event in the image of the visible element.

In another embodiment disclosed herein, a method of measuring latency includes triggering an event that generates an indication of the event at both a test component and a zero-latency indicator at substantially the same time. The indication of the event is sent from the test component to a multi-function display device, and a series of images are recorded with a camera, where each image contains both a representation of the zero-latency indicator and a representation of the multi-function display device. A computing device processes the series of images to compute a latency value of the test component based determining a time difference between the indication of the event by the zero-latency indicator and the multi-function display device.

In another embodiment disclosed herein, a method for measuring latency in electronic equipment includes generating pulsed source signals at a sensor aperture and at a multi-functional display and capturing a source illumination and multi-functional display illumination directly and through a sensor path using a high frame rate camera. A number of regions of interest are isolated for the source illumination and the multi-functional display illumination in video captured by the high frame rate camera. Peak thresholds are detected in the regions of interest and a plurality of binary waveforms are created based on the detected peak thresholds. A number of edges are detected from the binary waveform measuring one of rising or falling, and thereby, a delta time is measured between the source and the multi-functional display edges providing a latency measurement.

In another embodiment disclosed herein, a latency measurement system includes an event generation device that generates an event used to measure system latency. A component test system receives the event and in response outputs a continuously variable test component output signal to a mechanical system and a zero-latency indicator. A component in the mechanical system receives the continuously variable test component output signal causing motion of the component accordingly. A camera generates a series of recorded images, where each recorded image contains an image of the zero-latency indicator and an image of the component in the mechanical system. A processor determines the system latency by determining a time difference in the series of recorded images between a representation of an occurrence of the event in the image of the zero-latency indicator and a representation of the occurrence causing motion of the component based on the continuously variable test component output signal.

In another embodiment disclosed herein, a method of measuring latency includes triggering a continuously variable event that generates an indication of the continuously variable event at both a test component and a zero-latency indicator at substantially the same time. The indication of the continuously variable event is sent from the test component to a component in a mechanical system. A series of images are recorded with a camera, where each image contains both a representation of the zero-latency indicator and a representation of the component in the mechanical system. The series of images are processed by a computing device to compute a latency value of the test component based on determining a time difference between the indication of the continuously variable event by the zero-latency indicator and the component in the mechanical system.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

DETAILED DESCRIPTION

The following detailed description is directed to a latency measurement system for determining latency of specific components and systems of components within an electronics system. The latency measurement system provides an end to end measurement capability that does not alter the electronics system. In addition, the ability to record and process graphical images in a video format of operator displays allows for repeatability, removes manual errors, and enables the rapid collection of thousands of measurements that can generate statistical data about system latency that affect specific components and systems of components operating in the context of an electronics system.

Embodiments presented herein consist of equipment and associated signal processing used to measure critical timelines within electronics systems. The latency measurement system is flexible and applies, for example, to component sensor video images, warning indications, and inertial measurement. The system utilizes a non-intrusive measurement by means of an imaging camera that records images of external zero-latency event stimulus (e.g., LED, laser angle, etc.) and the associated system output at an operator display device. Automated image processing algorithms analyze the recorded sequential images to generate individual latency measurement and statistical representations of latency in the system (mean, standard deviation, histograms) based on thousands of automatic measurements from the recorded sequential images.

Imaging cameras, that may include high frame-rate video camera, capture end-to-end latency on operator display devices based on external triggered events picked up by sensors or hardware designed to output information to be displayed on the operator display device. The imaging cameras do not perturb system operations while taking sequential images which are then subsequently processed to determine system latency and statistical representations of system latency over a period of time.

Figure 1:
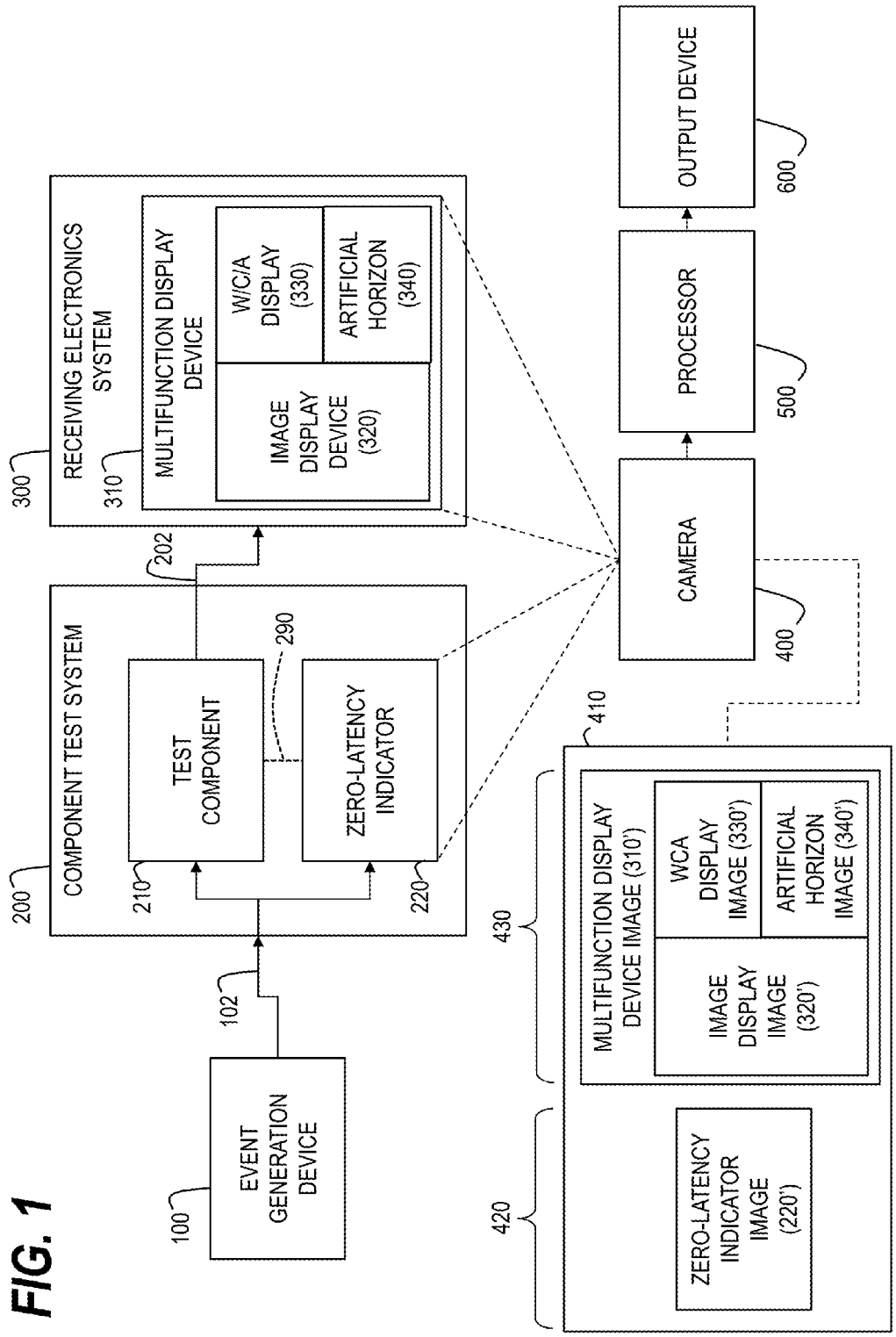
FIG. 1 illustrates a schematic diagram of at least one generic embodiment disclosed herein.

FIG. 1 illustrates a schematic diagram of an embodiment that generally typifies the embodiments described hereafter. An event generation device 100 generates an event 102 that is fed into a component test system 200. The generated event 102 may include an event trigger signal, rotation motion or electromagnetic radiation, where each generated event either produces or simulates a condition that is anticipated to be received by a zero-latency indicator 220 and may be received by a test component 210 and of the component test system 200. The generated event 102 may be transmitted to both the zero-latency indicator 220 and the test component 210 at substantially the same time, or may be transmitted to the zero-latency indicator 220 only wherein the output of the zero-latency indicator 220 may be relationally communicated 290 to the test component 210.

The component test system 200 may generally include at least a combination of the test component 210 that is to be tested for latency and the zero-latency indicator 220, and may further include some relationship 290 between these two elements as will be described hereafter. The zero-latency indicator may include an electromagnetic radiation emitter that may emit a visible or non-visible wave-length when the generated event 102 is received.

The test component 210 of the component test system 200 may transmit a test component output signal 202 to a receiving system such as a receiving electronics system 300 that includes a multifunctional display device 310. The multifunctional display device 310 may include at least one of, or a combination of, a graphical image display device 320 that graphically display images based on input received at the receiving electronics system 300, a warning/caution/advisory (WCA) indicator display 330 that is activated based on input received at the receiving electronics system 300, or an artificial horizon display 340 that corresponds to input received at the receiving electronics system 300. Additionally, the graphical image display device 320 may include the functionality of the WCA indicator display 330 and the artificial horizon display 340, or each component may be discretely separate from each other in the multifunction display device 310. The receiving electronics system 300 is capable of generating a visible element in any of these configurations based on receiving the test component output signal 202. Additionally, the receiving electronics system 300 that includes the multifunction display device 310 may be an avionics control system, a land vehicle control system or a ship control system.

A camera 400 generates a series of recorded images where each representative recorded image 410 contains an image 220' of the zero-latency indicator 220 and an image 310' of at least a portion of the multifunction display device 310 containing a visible element displayed thereon triggered by the test component 210. For example, the visible element on the multifunction display device 310 that is recorded may be an image of the image display device 320', a WCA indicator display image 330' and an artificial horizon image 340'. The series of recorded images may be recorded in a digital format as a video recording and may be performed at a high frame rate to detect small measurements of latency between images received and recorded in the camera 400.

A processor 500 receives the series of images from the camera 400 and analyzes each recorded image 410 with respect to successive recorded images. The processor locates in each recorded image a region of interest 420 where the zero-latency indicator image 220' is located, and a region of interest 430 on the multifunction display device image 310' that may include the image display device image 320', the WCA display image 330' and/or the artificial horizon image 340'. The processor may detect a time difference between a representation of an occurrence of an event the region of interest 420 within the zero-latency indicator image 220' and a representation of an occurrence of the event in the region of interest 430 on the multifunction display device image 310'. The detected time difference represents a measurement of latency between the occurrence of the event represented by the zero-latency indicator 220 and the occurrence of the same event transmitted to the test component 210 through the receiving electronics system 300 to an event generated display indication on a particular display portion on the multifunction display device 310.

An output device 600 connected to the processor 500 outputs the determined latency measurement in a print format, a graphical display or any other format capable of communication of component system latency to an operator testing a component for system latency in an electronics system.

Figure 2:
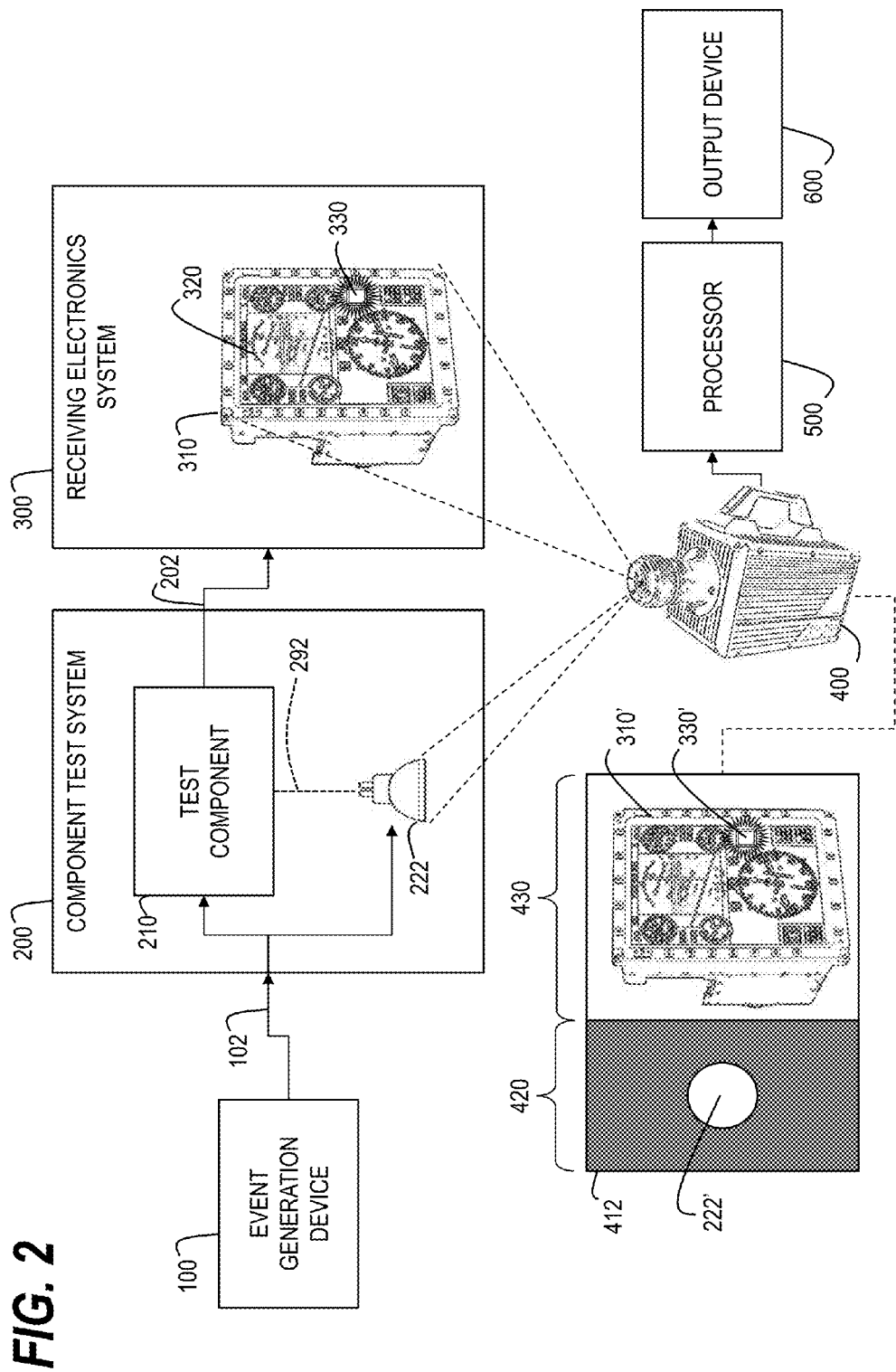
FIG. 2 illustrates a schematic diagram of a second embodiment disclosed herein.

FIG. 2 illustrates a schematic diagram of a second embodiment that determines component latency where an event generation device 100 generates an event 102 that is fed into a component test system 200. (Elements that remain substantially the same within difference embodiments will retain the same reference numbers.) The generated event 102 in this embodiment may include an event trigger signal or electromagnetic radiation, where the generated event either produces or simulates a condition that is anticipated to be received by a zero-latency indicator 222 and may be received by a test component 210 of the component test system 200. The zero-latency indicator 222 may include an electromagnetic radiation emitter that may include an infrared illumination source, a low-level visible light illumination source, a visible light source (e.g., a Light Emitting Diode (LED)), or a laser. The generated event 102 may be transmitted to both the zero-latency electromagnetic radiation emitter indicator 222 and the test component 210 at substantially the same time represented by reference number 292.

In this embodiment, the component test system 200 may include a combination of the test component 210 that is to be tested for latency and the zero-latency electromagnetic radiation emitter indicator 222. The test component 210 of the component test system 200 may transmit a test component output signal 202 to a receiving system such as a receiving electronics system 300 that includes a multifunctional display device 310. The multifunctional display device 310 in this embodiment may include a warning/caution/advisory (WCA) indicator display 330 that is activated based on input received at the electronics system that corresponds to input received at the electronics system. The receiving electronics system 300 is capable of generating a visible element at the WCA indicator display 330 based on receiving the test component output signal 202. This visible element may include a discrete warning light or a graphical representation on a graphics display.

A camera 400 generates a series of recorded images where each representative recorded image 412 contains an image 222' of the zero-latency indicator 222 and an image 310' of at least a portion of the multifunction display device 310 containing a visible element 330' displayed thereon triggered by the test component 210. The visible element recorded on the multifunction display device 310 in this embodiment may be an image of the WCA indicator display image 330', or may be an equivalent visible image displayed on the graphical display device 320 of the multifunction display device 310. These series of recorded images may be recorded in a digital format as a video recording and may be performed at a high frame rate to detect small measurements of latency between images received and recorded in the camera 400.

A processor 500 receives the series of images from the camera 400 and analyzes each recorded image 410 with respect to successive recorded images. The processor locates in each recorded image a region of interest 420 where the zero-latency electromagnetic radiation emitter indicator image 222' is located, and a region of interest 430 on the multifunction display device image 310' that includes the WCA display image 330'. The processor may detect a time difference between a representation of an occurrence of an event in the region of interest 420 within the zero-latency electromagnetic radiation emitter indicator image 222' and a representation of an occurrence of the event in the region of interest 430 on the multifunction display device image 310'. The detected time difference represents a measurement of latency between the occurrence of the event represented by the zero-latency electromagnetic radiation emitter indicator 222 and the occurrence of the same event transmitted to the test component 210 through the receiving electronics system 300 to an event generated display indication 330' on a particular display portion on the multifunction display device 310. The output device 600 connected to the processor 500 outputs the determined latency measurement in a print format, a graphical display or any other format capable of communication of component system latency to an operator testing a component for system latency in an electronics system.

Figure 3A:
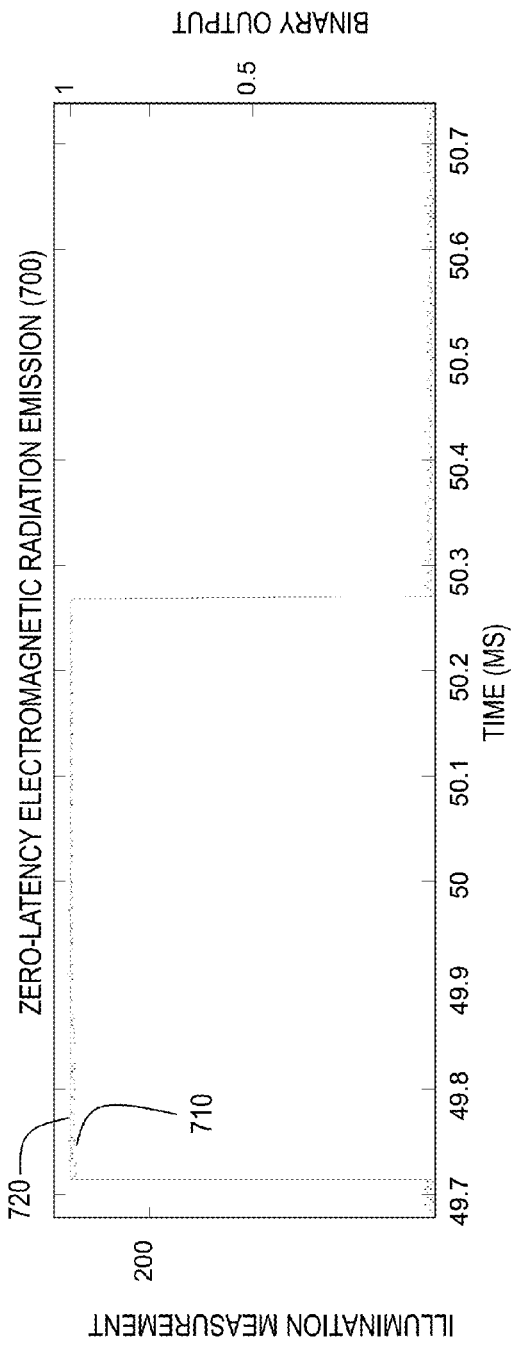
FIG. 3A illustrates a thresholding procedure to create binary waveforms for a region of interest containing a zero-latency indicator in a video frame.

FIG. 3A illustrates a thresholding procedure to create binary waveforms for a region of interest, e.g., 420, containing a zero-latency indicator in a video frame 412. A zero-latency electromagnetic radiation emission graph 700 illustrates a region of interest signal 710 being generated from the image of the zero-latency indicator, e.g., in FIG. 2, reference number 222'. A binary waveform 720 is generated from the region of interest signal 710 to define at least a leading edge of the zero-latency indicator with respect to a unit of time. Thus, a threshold is detected within the representation of the occurrence of the event in the image of the zero-latency indicator, and a plurality of binary waveforms are created based on detecting the threshold within the representation of the occurrence of the event in the image of the zero-latency indicator.

Figure 3B:
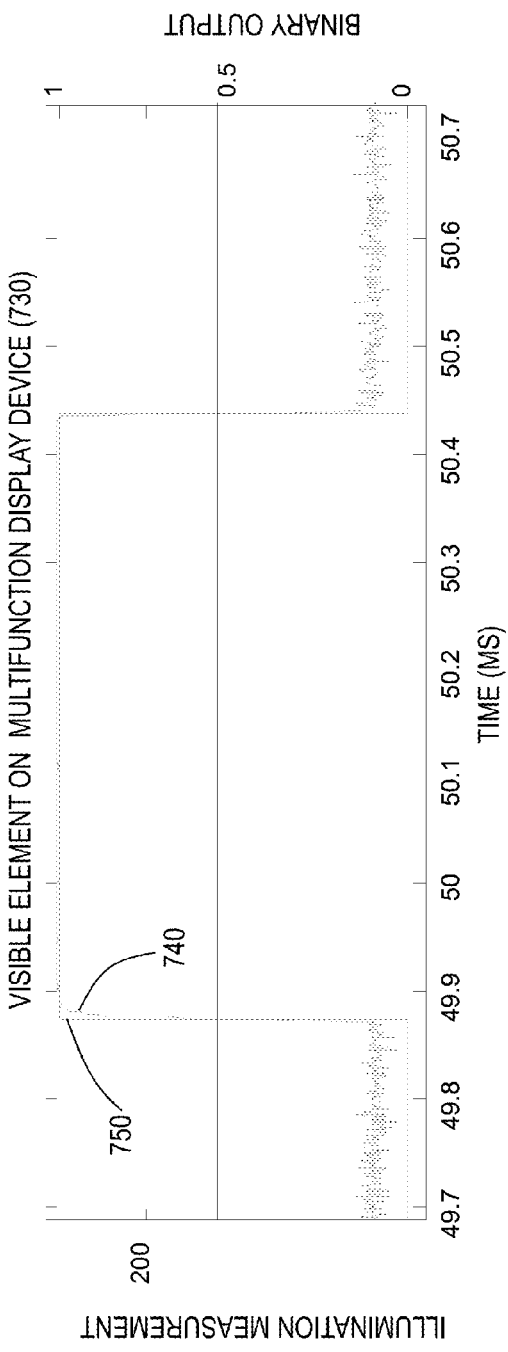
FIG. 3B illustrates a thresholding procedure to create binary waveforms for a region of interest containing a display element of the multifunction display in a video frame.

FIG. 3B illustrates a thresholding procedure to create binary waveforms for a region of interest e.g., 430 containing a display element of the multifunction display in a video frame 412. A visible element on the multifunction display device graph 730 illustrates a region of interest signal 740 being generated from the image of the multifunction display device, e.g., in FIG. 2, reference number 330'. A binary waveform 750 is generated from the region of interest signal 740 to define at least a leading edge of the visible element on the multifunction display device with respect to a unit of time. Thus, a threshold is detected within the representation of the occurrence of the event in the image of the visible element, and a plurality of binary waveforms are created based on detecting the threshold within the representation of the occurrence of the event in the image of the visible element.

Figure 4:
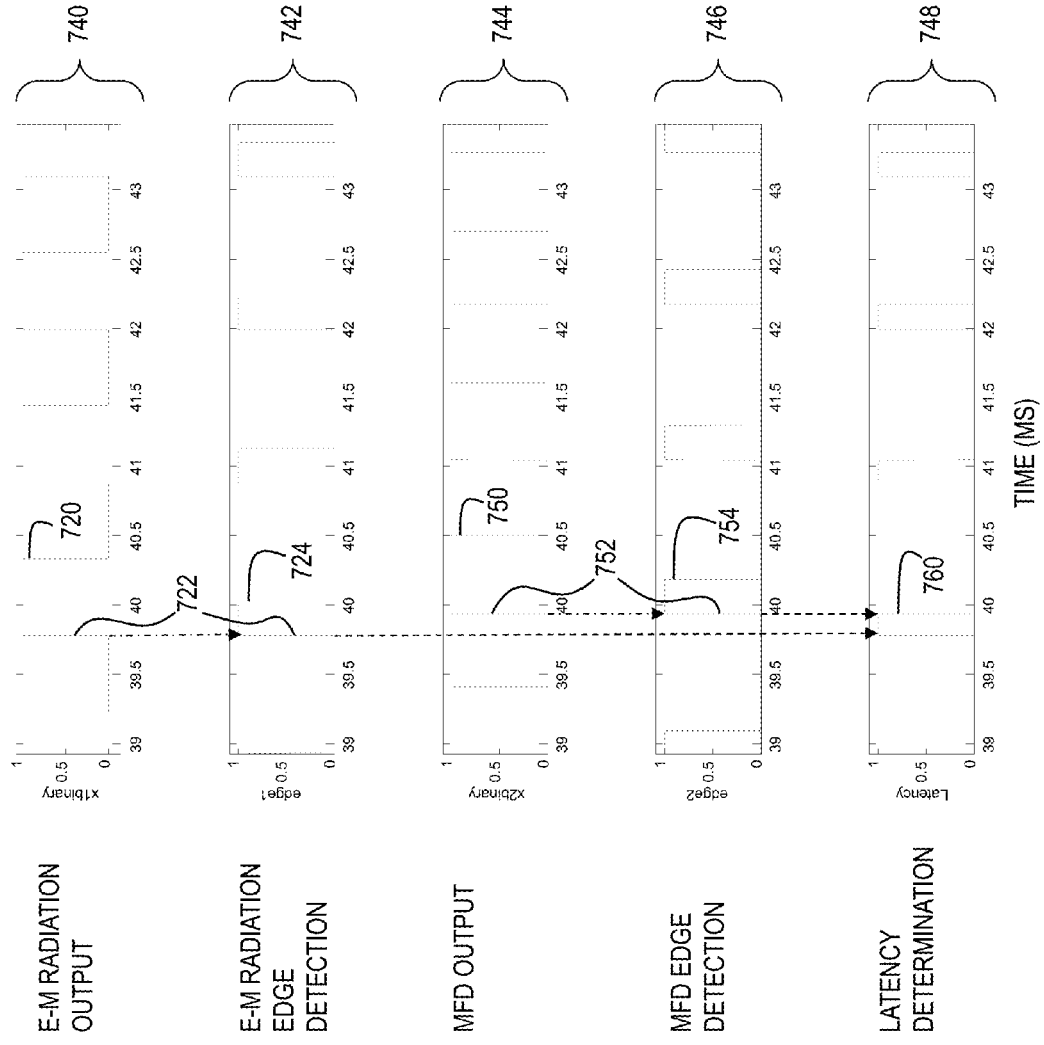
FIG. 4 illustrates a processing of binary waveforms created in FIG. 3 to detect edges and thereby determine a latency measurement.

FIG. 4 illustrates a processing of binary waveforms created in FIG. 3 to detect edges and thereby determine a latency measurement. Graph 740 illustrates a binary waveform 720 of electromagnetic radiation output of, e.g., the zero-latency indicator 222. Graph 742 illustrates the detection of edges 724 for each of the plurality of binary waveforms that measure one of rising or falling, where a leading edge 722 is a rising edge. Graph 744 illustrates a binary waveform 750 of a visible element 330' of a multifunction display device, e.g., of the WCA indicator 330. Graph 746 illustrates the detection of edges 754 for each of the plurality of binary waveforms that measure one of rising or falling, where a leading edge 752 is a rising edge. Graph 748 illustrates measuring a delta time 760 between the leading edge of the zero-latency indicator 722 and the leading edge of the image of the visible element in the multi-function display device 752 based on the detected edges for each of the plurality of binary waveforms. Automated image processing algorithms may then further analyze the recorded sequential images and their corresponding extracted edges to generate individual latency measurements and statistical representations of latency measurements in the system (e.g., mean, standard deviation, histograms) based on thousands of automatic measurements from the recorded sequential images.

Figure 5:
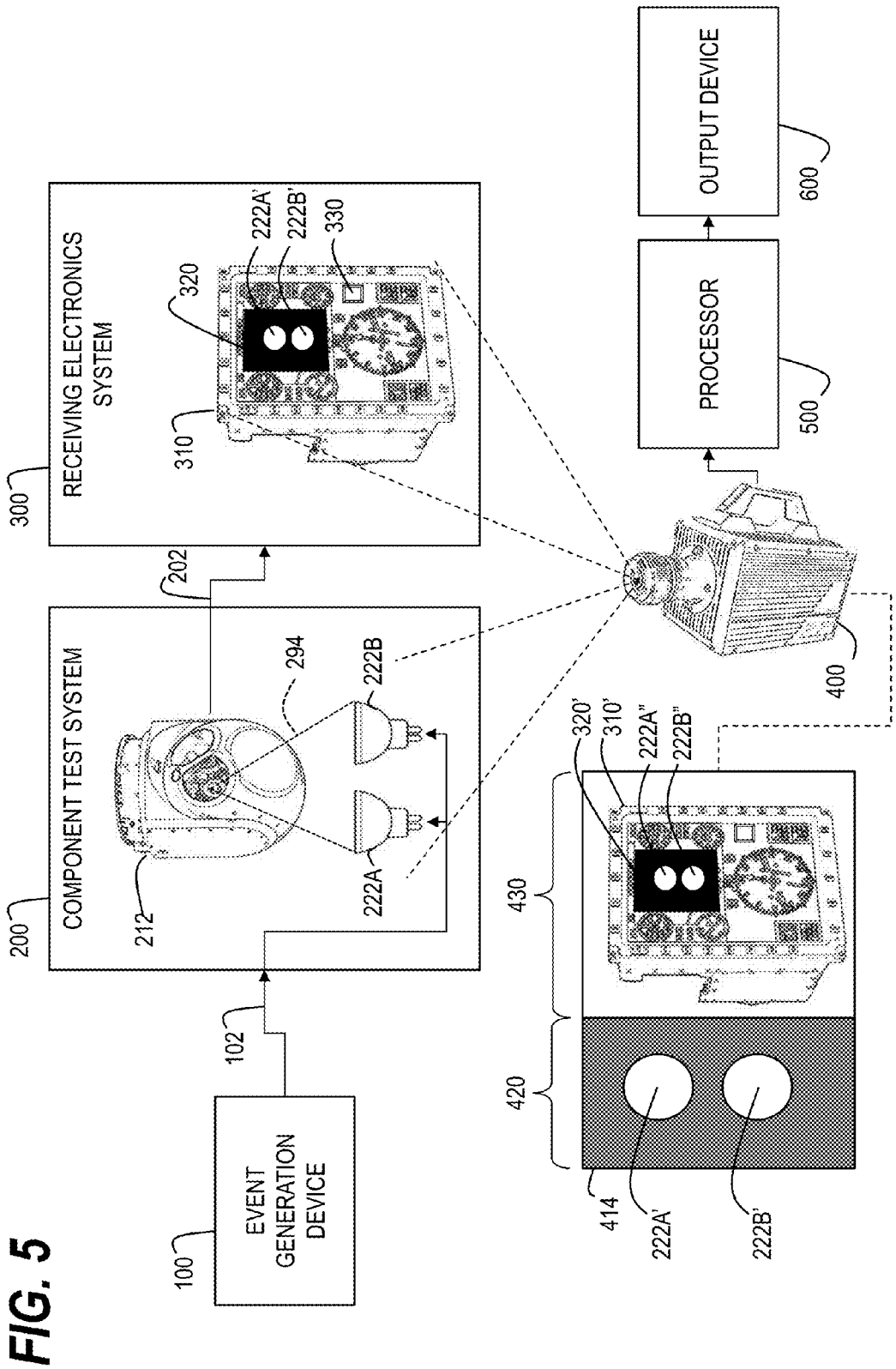
FIG. 5 illustrates a schematic diagram of a third embodiment disclosed herein.

FIG. 5 illustrates a schematic diagram of a third embodiment that determines video signal latency where an event generation device 100 generates an event 102 that is fed into a component test system 200. The generated event 102 may include an event trigger signal or electromagnetic radiation, where each generated event either produces or simulates a condition that is received by zero-latency indicators 222A and 222B. The zero-latency indicators 222A and 222B may include an infrared illumination source, a low-level visible light illumination source, a visible light source or a laser output. When the zero-latency indicators 222A and 222B receive a trigger signal event 102 from the event generation device 100, they may emit electromagnetic radiation depending on the nature of the type of emitter. In a representative example, indicator 222A may include an infrared illumination source that outputs an infrared emission and indicator 222B may include a visible light source that outputs a visible light emission. Both of the indicators 222A and 222B receive the trigger signal event 102 at substantially the same time and emit their respective radiation. The emitted radiation from the zero-latency indicators 222A and 222B is communicated 294 to a component that may include an Electro-Optical/Infrared (EO/IR) imaging sensor 212 capable of receiving a plurality of electromagnetic radiation wavelengths, for example in this case, the visible light and infrared wavelengths.

The EO/IR imaging sensor 212 of the component test system 200 may transmit an output signal 202 to a receiving system such as a receiving electronics system 300 that includes a multifunctional display device 310. The multifunctional display device 310 may include a graphical image display device 320 that graphically display images based input received at the electronics system from the EO/IR imaging sensor 212. In this embodiment, the graphical image display device 320 produces a visible image of either one or both the zero-latency indicators 222A and 222B triggered by the event signal 102.

A camera 400 generates a series of recorded images where each representative recorded image 414 contains an image or images 222A' and/or 222B' one or both of the zero-latency indicators 222A and 222B, and an image 310' of at least a portion of the multifunction display device 310 containing a visible element 222A'' and/or 222B'' displayed thereon based on the output by the test EO/IR component 212. Alternatively described, the recorded images as represented by recorded image 414 contain, in a first region of interest 420, first generation image(s) 222A' and/or 222B' of the zero-latency indicators 222A/222B, and in second region of interest 430, second generation image(s) 222A'' and/or 222B'' of the zero-latency indicators 222A/222B as graphically depicted on the graphical image display device 320 of the multifunction display device 310.

A processor 500 receives the series of images from the camera 400 and analyzes each recorded image 410 with respect to successive recorded images. The processor locates in each recorded image a region of interest 420 where the zero-latency indicator image(s) 222A' and/or 222B' is located, and a region of interest 430 on the multifunction display device image 310' that may include the image display device image 320' graphically representing the second generation images of the zero-latency indicator image(s) 222A'' and/or 222B''. The processor may detect a time difference between a representation of an occurrence of an event the region of interest 420 within the zero-latency indicator image(s) 222A' and/or 222B' and a representation of an occurrence of the event(s) 222A'' and/or 222B'' in the region of interest 430 on the multifunction display device image 310'. The detected time difference represents a measurement of latency between the occurrence of the event represented by the zero-latency indicator(s) 222A and/or 222B and the optically sensed occurrence of the same event transmitted by the test EO/IR component 210 to the receiving electronics system 300 to an event generated display indication 222A' and/or 222B' on a the graphical image display of the multifunction display device 310. An output device 600 connected to the processor 500 outputs the determined latency measurement in a print format, a graphical display or any other format capable of communication of component system latency to an operator testing a component for system latency in an electronics system.

Figure 6:
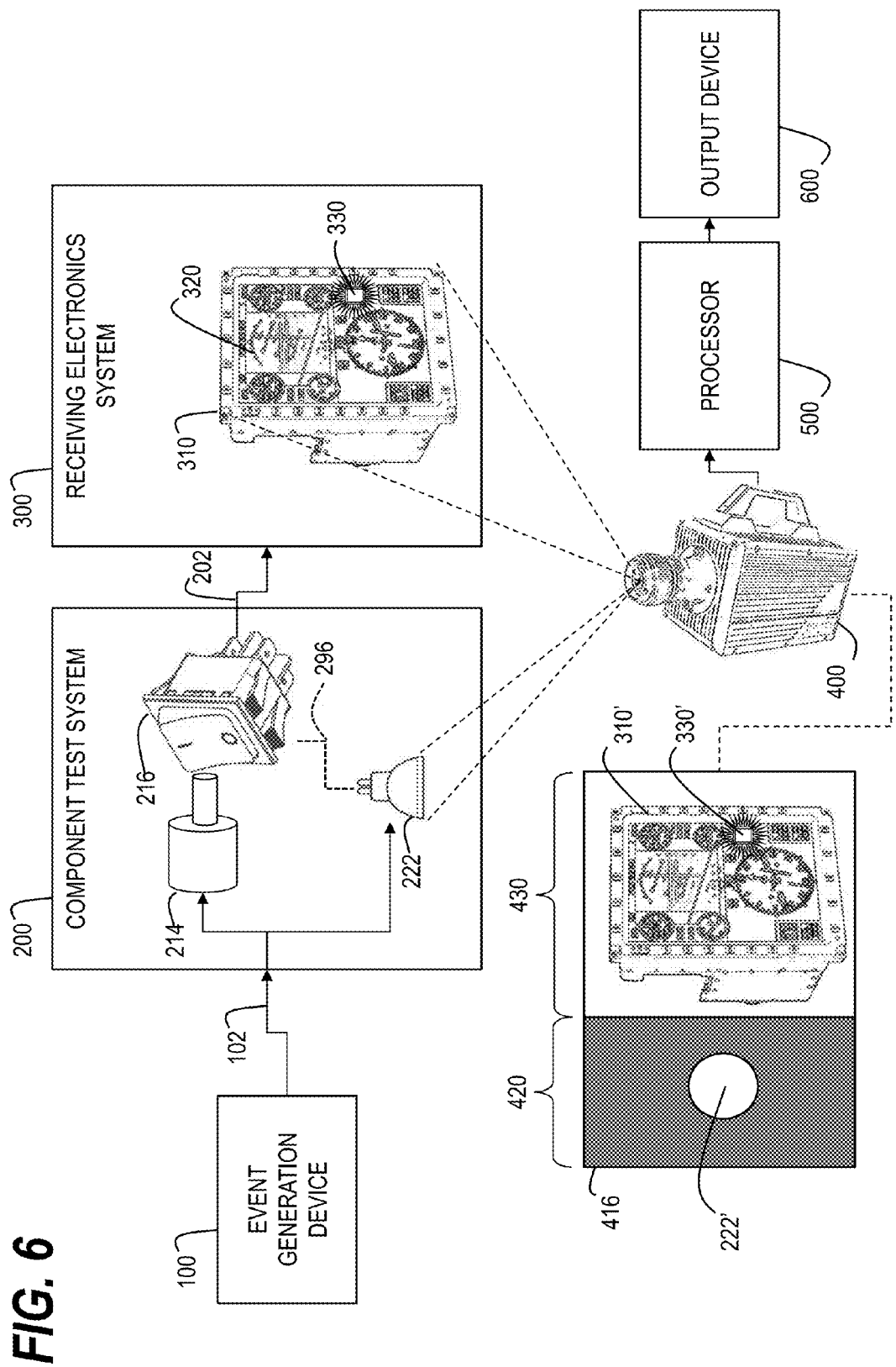
FIG. 6 illustrates a schematic diagram of a fourth embodiment disclosed herein.

FIG. 6 illustrates a schematic diagram of a fourth embodiment that determines hardware latency where an event generation device 100 generates an event 102 that is fed into a component test system 200. The generated event 102 may include an event trigger signal or electromagnetic radiation, where each generated event either produces or simulates a condition that is anticipated to be received by a zero-latency electromagnetic radiation emission indicator 222, (similar to that of FIGS. 2 and 5), and may be received by a test component actuator 214 and switch 216 of the component test system 200. The generated event 102 may be transmitted to both the zero-latency electromagnetic radiation emission indicator 222 and the test component actuator 214 and switch 216 at substantially the same time 296.

The test component switch 216 of the component test system 200 may transmit a test component output signal 202 to a receiving system such as a receiving electronics system 300 that includes a multifunctional display device 310. The multifunctional display device 310 in this embodiment may include a graphical image display device 320 that graphically display images based input received at the electronics system, and/or a warning/caution/advisory (WCA) indicator display 330 that is activated based input received at the electronics system. The electronics system is capable of generating a visible element with either of these configurations based on receiving the test component output signal 202.

A camera 400 generates a series of recorded images where each representative recorded image 416 contains an image 222' of the zero-latency indicator 222 and an image 310' of at least a portion of the multifunction display device 310 containing a visible element 330' displayed thereon triggered by the test component 210. The visible element recorded on the multifunction display device 310 in this embodiment may be an image of the WCA indicator display image 330' or may be an equivalent visible image displayed on the graphical display device 320 of the multifunction display device 310. These series of recorded images may be recorded in a digital format as a video recording and may be performed at a high frame rate to detect small measurements of latency between images received and recorded in the camera 400.

A processor 500 receives the series of images from the camera 400 and analyzes each recorded image 410 with respect to successive recorded images. The processor locates in each recorded image a region of interest 420 where the zero-latency electromagnetic radiation emitter indicator image 222' is located, and a region of interest 430 on the multifunction display device image 310' that includes, for example, the WCA display image 330'. The processor may detect a time difference between a representation of an occurrence of an event the region of interest 420 within the zero-latency electromagnetic radiation emitter indicator image 222' and a representation of an occurrence of the event in the region of interest 430 on the multifunction display device image 310'. The detected time difference represents a measurement of latency between the occurrence of the event represented by the zero-latency electromagnetic radiation emitter indicator 222 and the occurrence of the same event transmitted to the test component actuator 214 and switch 216 through the receiving electronics system 300 to an event generated display indication 330' on a particular display portion on the multifunction display device 310. The output device 600 connected to the processor 500 outputs the determined latency measurement in a print format, a graphical display or any other format capable of communication of component system latency to an operator testing a component for system latency in an electronics system.

Figure 7:
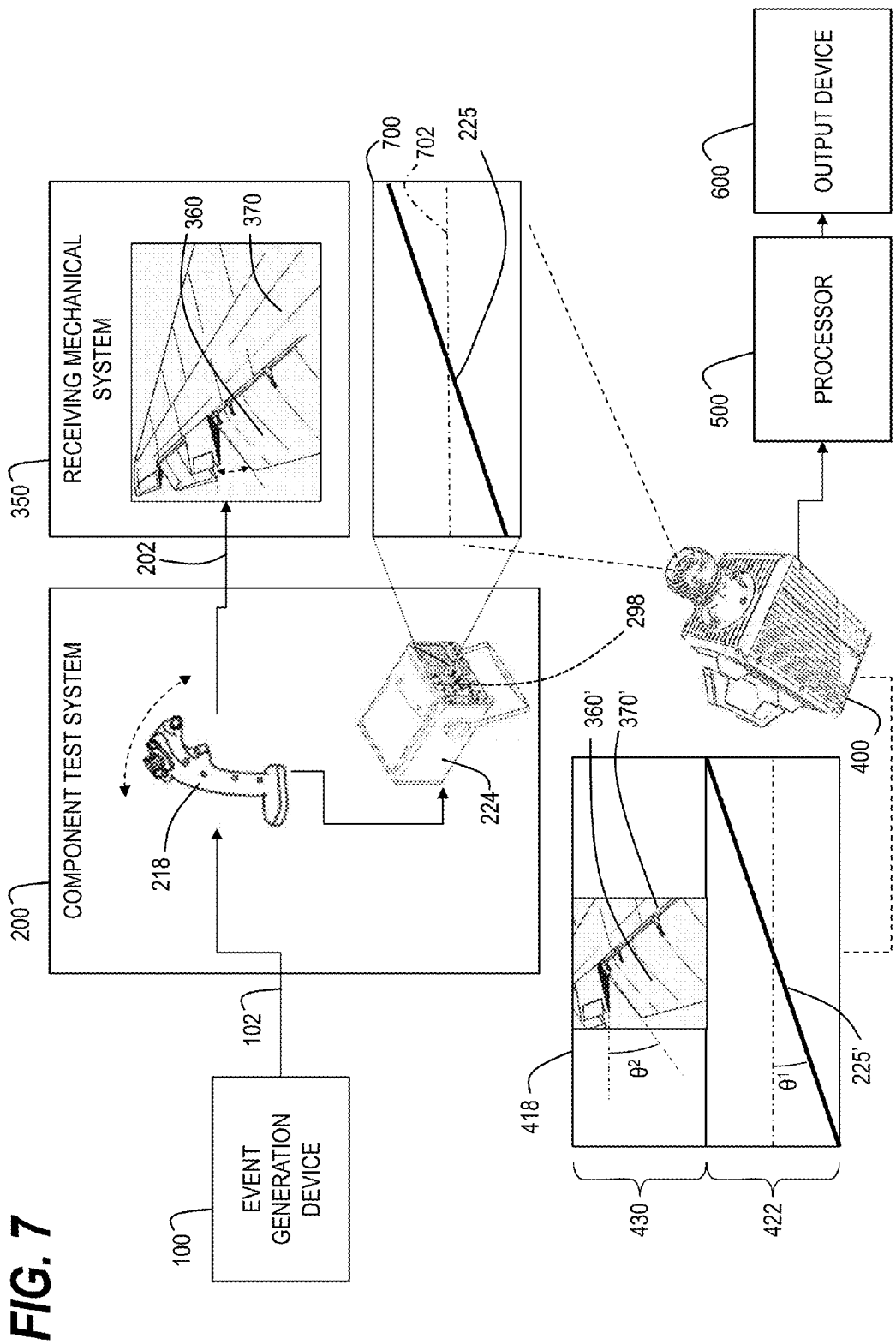
FIG. 7 illustrates a schematic diagram of a fifth embodiment disclosed herein.

FIG. 7 illustrates a schematic diagram of a fifth embodiment that determines a latency of continuous variable position controller where an event generation device 100 generates an event 102 that is fed into a component test system 200. The generated event 102 in this embodiment may include a motion that produces a mechanical response in continuous variable controller 218, such as a joystick, which is connected to a zero-latency indicator 224, of the component test system 200. The zero-latency indicator 224 can include an oscilloscope or any other equipment that generates a graphical indication of the motion of the continuous variable controller 218.

The generated event 102 can include either an automated motion, similar to the test component actuator 214 of FIG. 6, or a manual actuated motion. This event 102 motion on the continuous variable controller 218 is output via a component test system output signal 202 to receiving system such as a receiving mechanical system 350, exemplary represented by an aileron 360 of an aircraft wing 370, and simultaneously output to the zero-latency indicator 224. The zero-latency indicator 224 creates a visual representation 225 of the position of the continuous variable controller 218 on a graphical screen 700 that bears a visible horizontal reference line 702 such that an angle of rotation of the visual representation 225 may be calculated based on the horizon reference line 702.

A camera 400 generates a series of recorded images where each representative recorded image 418 contains a region of interest 422 that contains the image of the visual representation 225' of the zero-latency indicator 224 and a region of interest 430 that contains an image of the mechanical system 300, for example, an image of aileron 360' of the aircraft wing 370' moving under control of mechanical actuation of the continuously variable controller 218.

A processor 500 receives the series of images from the camera 400 and analyzes each recorded image 418 with respect to successive recorded images. The processor locates in each recorded image 418 the region of interest 422 where the image of the zero-latency indicator 224 visual representation 225' is located, and a region of interest 430 on the receiving mechanical system 350 including, for example, the aileron 360 of the aircraft wing 370. The processor then determines an angle $\theta^1$ of the zero-latency indicator 224 visual representation 225' with respect to a horizontal reference line 702, and an angle $\theta^2$ the receiving mechanical system 350, for example, the aileron 360 with respect to the aircraft wing 370. The processor then determines difference in a rate of angular change between the representation of $\theta^1$ of the zero-latency indicator and a rate of angular change of the representation of $\theta^2$ of the receiving mechanical system 350, for example, the aileron 360 with respect to the aircraft wing 370, in response to the actuation of the continuously variable controller 218.

In summary, a latency measurement system includes an event generation device that generates an event used to measure system latency. A component test system receives the event, and in response outputs a continuously variable test component output signal to a component in a mechanical system and a zero-latency indicator. The component in the mechanical system receives the continuously variable test component output signal causing motion of the component accordingly. A camera generates a series of recorded images, where each recorded image contains an image of the zero-latency indicator and an image of the component in the mechanical system. A processor determines the system latency by determining a time difference in the series of recorded images between a representation of an occurrence of the event in the image of the zero-latency indicator and a representation of the occurrence causing motion of the component based on the continuously variable test component output signal.

Figure 8:
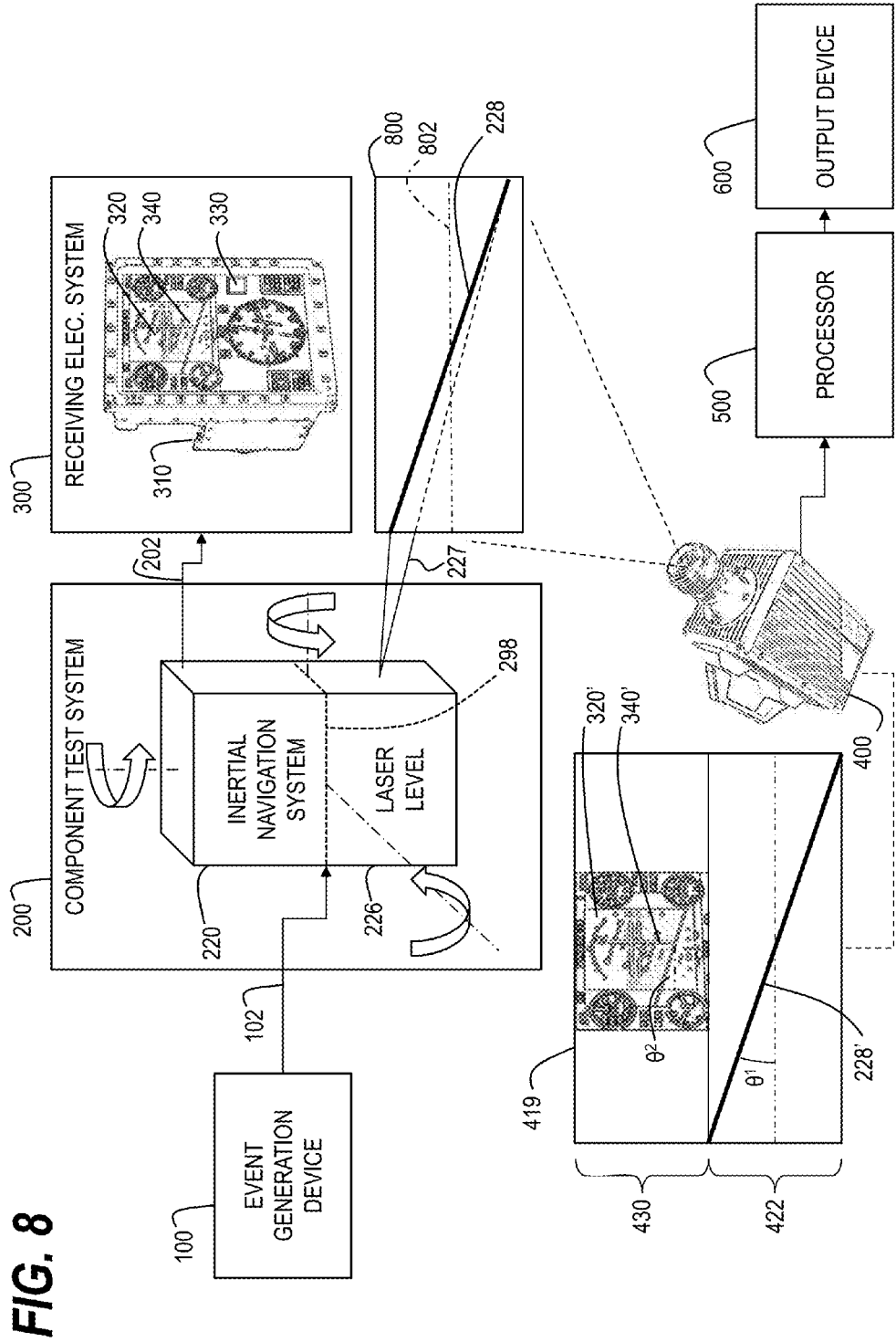
FIG. 8 illustrates a schematic diagram of a sixth embodiment disclosed herein.

FIG. 8 illustrates a schematic diagram of a sixth embodiment that determines Inertial Navigation System (INS) latency where an event generation device 100 generates an event 102 that is fed into a component test system 200. The generated event 102 in this embodiment may include rotation motion, (in any of three axes), that either produces or simulates a condition anticipated to be received by a zero-latency laser level indicator 226 directly connected/attached 298 to an INS 220 of the component test system 200. The rotational motion generated event 102 is transmitted to both the zero-latency laser level indicator 226 and the INS 220 at the substantially the same time by nature of both unit being secured to each other. An alternative configuration may include an INS 220 and a zero-latency laser level indicator 226 being separated from each other but being subject to the exact same rotational motion event 102.

The INS 220 of the component test system 200 may transmit a test component output signal 202 to a receiving system such as a receiving electronics system 300 that includes a multifunctional display device 310. The multifunctional display device 310 may include a graphical image display device 320 that graphically display images based input received at the electronics system, and/or an artificial horizon display 340 that corresponds to input received at the receiving electronics system 300. Additionally, the graphical image display device 320 may include the functionality of the artificial horizon display 340, or each component may be discretely separate from each other in the multifunction display device 310. The receiving electronics system 300 is capable of generating a visible element, i.e., an artificial horizon, in any of these configurations based on receiving the INS 220 output signal 202.

The zero-latency laser level indicator 226 projects through its aperture a linear laser projection 227 representing a horizontal horizon line relative to the INS 220. A laser line 228 from the projection 227 is imaged onto a surface 800 that bears a visible horizontal reference line 802 such that an angle of rotation of the laser line 228 may be calculated from any discrepancy between the visible horizon reference line 802 and the projected laser line 228.

A camera 400 generates a series of recorded images where each representative recorded image 419 contains a region of interest 422 that contains an image of the zero-latency projected laser line 228' and a region of interest 430 that contains an image of the graphic display device 320' of the multifunction display device 310 containing an artificial horizon element 340' generated by the INS 220. The recorded image of the artificial horizon 340' on the multifunction display device 310 may be an image from the image display device 320' or may be an image from a dedicated artificial horizon device 340.

A processor 500 receives the series of images from the camera 400 and analyzes each recorded image 419 with respect to successive recorded images. The processor locates in each recorded image a region of interest 422 where the zero-latency projected laser line indicator image 228' is located, and a region of interest 430 on the multifunction display device image 310' that may include the image display device image 320' and/or the artificial horizon image 340'. The processor then determines an angle $\theta^1$ of the zero-latency projected laser line indicator image 228' with respect to a horizontal reference line 802, and an angle $\theta^2$ the artificial horizon with respect to a horizontal reference line overlaid on the graphic display device 320 or the artificial horizon display 340. The processor then determines difference in a rate of angular change between the representation of $\theta^1$ of the zero-latency indicator and a rate of angular change of the representation of $\theta^2$ of the artificial horizon based on the output from the INS 220.

Figure 9:
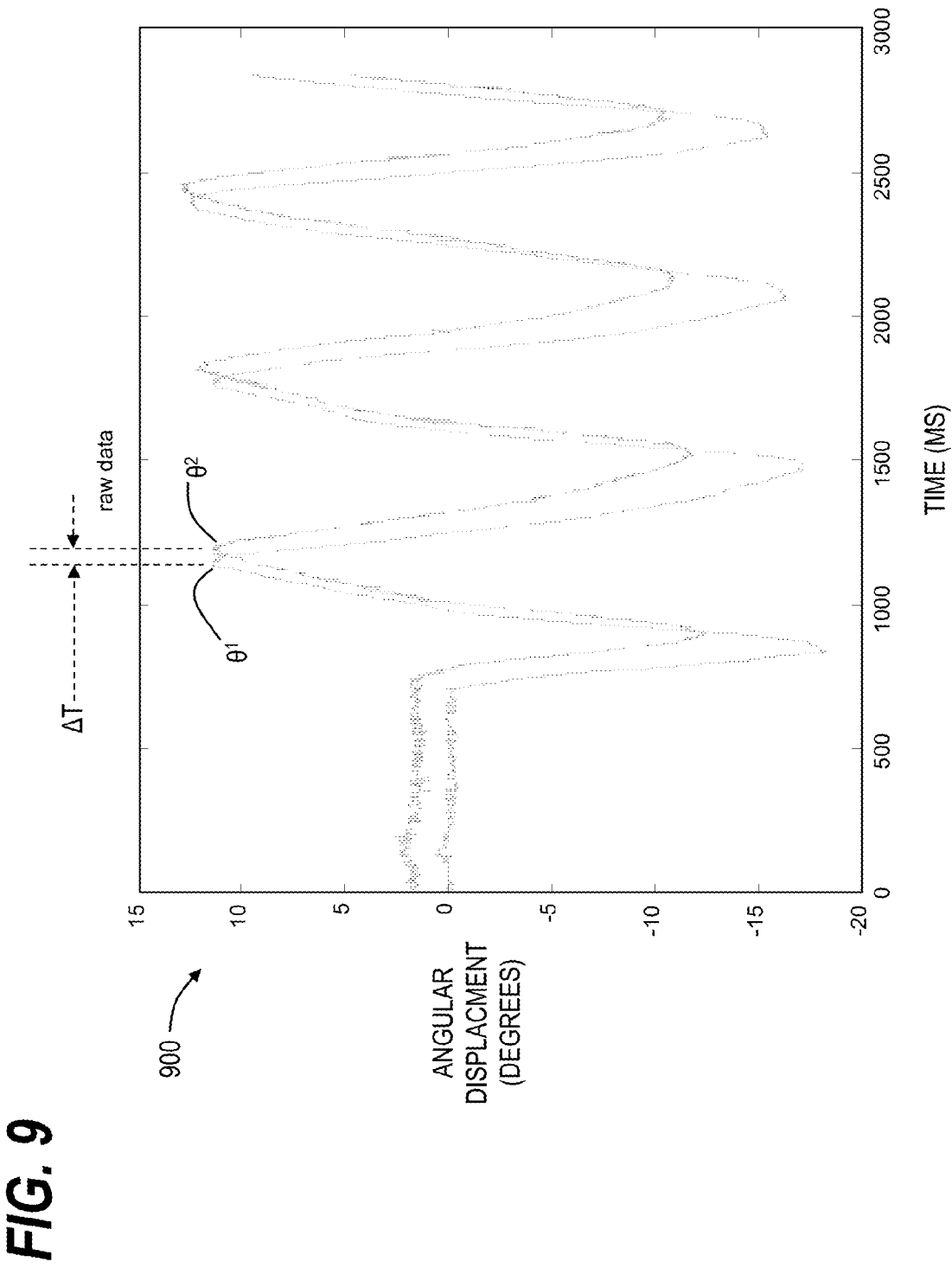
FIG. 9 illustrates a graph of a rate of angular change over time related to the embodiments illustrated in FIGS. 7-8.

FIG. 9 illustrates a graph 900 of a rate of angular change of the image of the visual representation 225' of the zero-latency indicator 224 and the receiving mechanical system 350 motion of, for example, an aileron 360' of FIG. 7, and similarly, the zero-latency projected laser line image 228' and the artificial horizon image 340' over time related to the embodiment as illustrated in FIG. 8.

The processor 500 can detect a time difference, $\Delta T$, between an angular displacement for $\theta^1$ and an angular displacement for $\theta^2$. For FIG. 7 the detected time difference represents a measurement of latency between the occurrence of the motion event 102 represented by the image of visual representation 225' and the image of the receiving mechanical system 300 component, for example, the aileron 360'. For FIG. 8, the detected time difference represents a measurement of latency between the occurrence of the event of rotational motion represented by the projection 228 of the zero-latency laser level indicator 226, and the artificial horizon 340 visible output transmitted from the INS 218 through the receiving electronics system 300 to the multifunction display device 310. The output device 600 connected to the processor 500 outputs the determined latency measurement in a print format, a graphical display or any other format capable of communication of component system latency to an operator testing a component for system latency in an electronics system.

Figure 10:
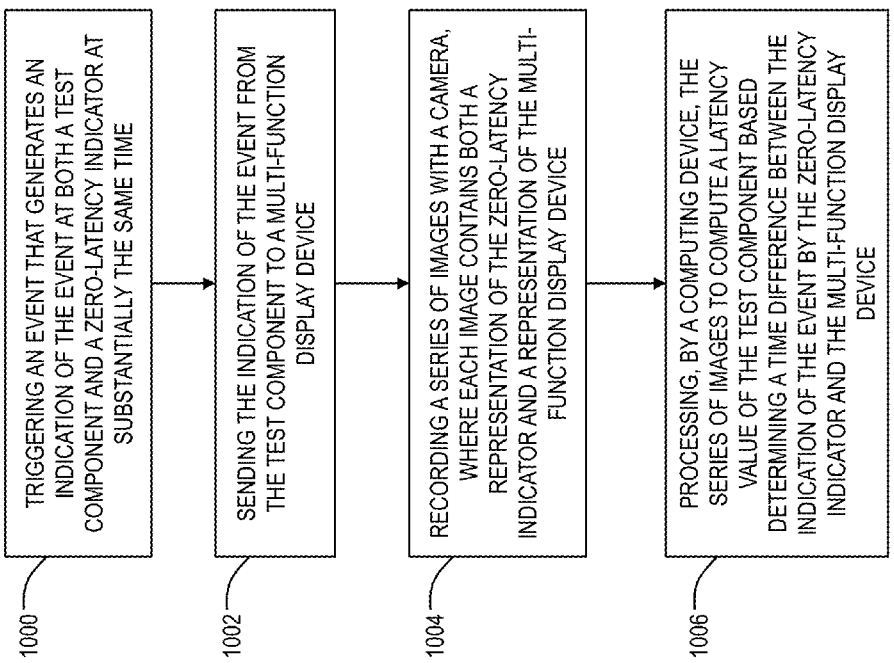
FIG. 10 illustrates a logic flowchart of a method of determining a latency of a test component in an electronics system.

FIG. 10 illustrates a logic flowchart of a method of determining latency by triggering 1000 an event that generates an indication of the event at both a test component and a zero-latency indicator at substantially the same time. An indication of the event is sent 1002 from the test component to a multi-function display device. A series of images are recorded 1004 with a camera, where each image contains both a representation of the zero-latency indicator and a representation of the multi-function display device. The series of images are processed 1006 by a computing device to compute a latency value of the test component based determining a time difference between the indication of the event by the zero-latency indicator and the multi-function display device.

Figure 11:
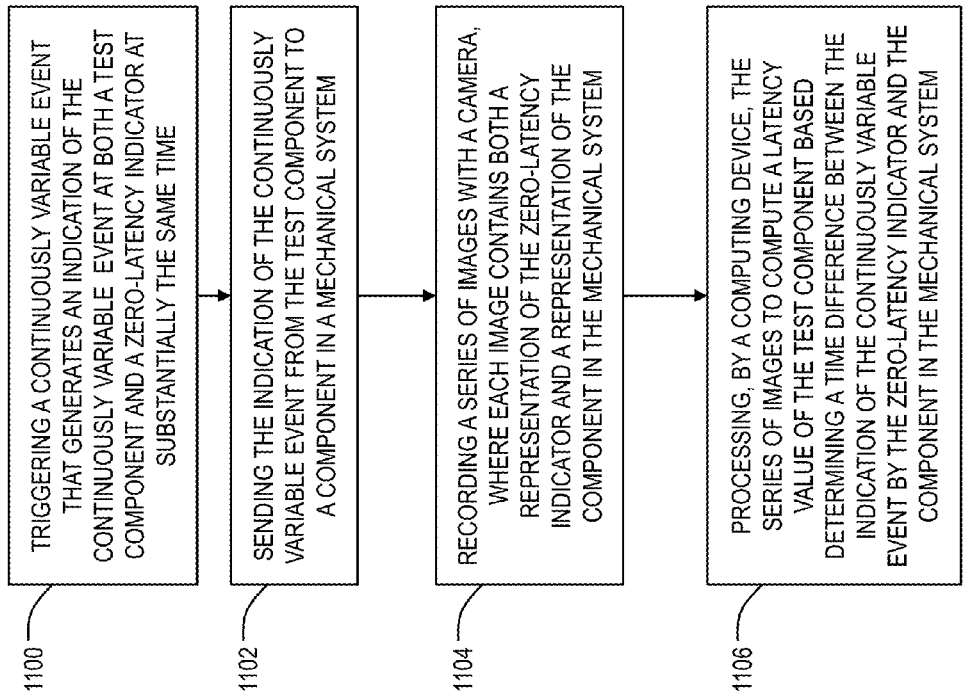
FIG. 11 illustrates a logic flowchart of a method of determining a latency of text component in a mechanical system.

FIG. 11 illustrates a logic flowchart of a method of determining latency by triggering 1100 a continuously variable event that generates an indication of the continuously variable event at both a test component and a zero-latency indicator at substantially the same time. An indication of the continuously variable event is sent 1102 from the test component to a component in a mechanical system. A series of images are recorded 1104 with a camera, where each image contains both a representation of the zero-latency indicator and a representation of the component in the mechanical system. The series of images are processed 1106 by a computing device to compute a latency value of the test component based determining a time difference between the indication of the continuously variable event by the zero-latency indicator and the component in the mechanical system.

The triggering of the event may include one of generating an event trigger signal, generating rotational motion, or transmitting electromagnetic radiation. The method may further include emitting an electromagnetic radiation emission from the zero-latency indicator based on receiving the indication of the event at the zero-latency indicator. The emitting of the electromagnetic radiation emission may further include at least one of emitting an infrared illumination source, emitting a low-level visible light illumination source, emitting a visible light source, or emitting a laser output of a laser level.

Sending the indication of the event may further include sending the indication through an electronics system to the multi-function display device, and upon receipt at the multi-function display device, displaying a visible element on the multi-function display device based on receiving the indication of the event. The visible element displayed on the multi-function display device may include one of displaying the visible element on a graphical image display device that graphically outputs display images based input received at the electronics system, displaying the visible element on a warning/caution/advisory (WCA) indicator that is activated based input received at the electronics system, and/or displaying the visible element on an artificial horizon display that corresponds to input received at the electronics system.

The processing the series of images may further include detecting a threshold within the representation of the zero-latency indicator and a threshold within the representation a visible element displayed on the multi-function display device. A plurality of binary waveforms may be created based on detecting the threshold within the representation of the zero-latency indicator and a threshold within the representation of the visible element displayed on the multi-function display device. Edges are detected for each of the plurality of binary waveforms that measure one of rising and falling. A delta time is measured between the zero-latency indicator and the representation of the visible element on the multi-function display device based on the detected edges for each of the plurality of binary waveforms.

In one embodiment, the method of measuring latency in determining a time difference includes determining the difference in a rate of angular change between the indication of the event by the zero-latency indicator and a rate of angular change of a representation of a visible element on the multi-function display unit.

Another embodiment for a method of measuring latency in electronic equipment includes generating pulsed source signals at a sensor aperture and at a multi-functional display, and capturing a source illumination and multi-functional display illumination directly and through a sensor path using a high frame rate camera. A plurality of regions of interest are isolated for the source illumination and the multi-functional display illumination in video captured by the high frame rate camera. Peak thresholds are detected in the regions of interest and a plurality of binary waveforms are created based on the detected peak thresholds. A plurality of edges of the binary waveform are detected measuring one of rising or falling, and based on the leading edges, a delta time is measured between the source and the multi-functional display edges providing a latency measurement.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. A latency measurement system, the system comprising:
an event generation device that generates an event used to measure system latency;
a component test system that receives the event and in response outputs a test component output signal and changes a state of a zero-latency indicator to produce a visual output representing receipt of the event;
a receiving system that receives the test component output signal and outputs a corresponding visible element;
a camera that generates a series of recorded images, where each recorded image contains an image of the zero-latency indicator and an image of the visible element; and
a processor that determines the system latency by determining a time difference in the series of recorded images between a representation of an occurrence of the change of state of the zero-latency indicator in the image and a representation of the occurrence of the event in the image of the visible element.

2. The latency measurement system of claim 1, wherein the generated event further comprises one of:
an event trigger signal;
rotational motion;
electromagnetic radiation; or
continuous motion.

3. The latency measurement system of claim 1, wherein the component test system further comprises one of:
a combination of an imaging device and an electromagnetic radiation emitter;
a combination of an actuator that actuates a switch and an electromagnetic radiation emitter;
a combination of an inertial navigation system and an electromagnetic radiation emitter; or
a combination of a continuous variable controller and an electromagnetic radiation emitter.

4. The latency measurement system of claim 1, zero-latency indicator comprises an electromagnetic radiation emitter, and wherein the change of state of the electromagnetic radiation emitter comprises one of the emitter beginning to emit electromagnetic radiation and the emitter ceasing to emit electromagnetic radiation.

5. The latency measurement system of claim 4, wherein the electromagnetic radiation emitter further comprises:
an infrared illumination source;
a low-level visible light illumination source;
a visible light source; or
a laser output of a laser level.

6. The latency measurement system of claim 1, wherein the receiving system further comprises at least one of:
an avionics control system;
a vehicle control system; or
a ship control system.

7. The latency measurement system of claim 1, further including a multi-function display for displaying the visible element, wherein the multi-function display device further comprises at least one of:
a graphical image display device that graphically displays images based input received at the receiving system;
a warning/caution/advisory (WCA) indicator display that is activated based input received at the receiving system; or
an artificial horizon display that corresponds to input received at the receiving system.

8. The latency measurement system of claim 1, where determining the time difference further comprises:
detecting a threshold within the representation of the occurrence of the change of state of the zero-latency indicator in the image and a threshold within the representation of the occurrence of the event in the image of the visible element;
creating a plurality of binary waveforms based on detecting the threshold within the representation of the occurrence of the change of state of the zero-latency indicator in the image and the threshold within the representation of the occurrence of the event in the image of the visible element;
detecting edges for each of the plurality of binary waveforms that measure one of rising or falling; and
measuring a delta time between the zero-latency indicator and the image of the visible element based on the detected edges for each of the plurality of binary waveforms.

9. The latency measurement system of claim 1, wherein determining the time difference further comprises:
determining the difference in a rate of angular change between the representation of the occurrence of the change of state of the zero-latency indicator in the image and a rate of angular change of the representation of the occurrence of the event in the image of the visible element.

10. A method of measuring latency, the method comprising:
triggering an event that generates an indication of the event and changes a state of a zero-latency indicator at substantially the same time to produce a visual output representing receipt of the event;
recording a series of images with a camera, where each image contains both a representation of the zero-latency indicator and a representation of the indication of the event; and
processing, by a computing device, the series of images to compute a latency value based on determining a time difference between the indication of the event and the change of state of the zero-latency indicator.

11. The method of measuring latency according to claim 10, wherein the triggering an event further comprises one of:
- generating an event trigger signal;
- generating rotational motion; or
- transmitting electromagnetic radiation.

12. The method of measuring latency according to claim 10, further comprising:
- wherein the change of state of the zero-latency indicator comprises emitting an electromagnetic radiation emission corresponding to the zero-latency indicator based on receiving the indication of the event.

13. The method of measuring latency according to claim 12, wherein the emitting the electromagnetic radiation emission further comprises one of:
- emitting an infrared illumination source;
- emitting a low-level visible light illumination source;
- emitting a visible light source; or
- emitting a laser output of a laser level.

14. The method of measuring latency according to claim 10, further comprising:
- sending the indication of the event from a test component to a multi-function display device, wherein the sending the indication of the event further comprises sending the indication through an electronics system to the multi-function display device.

15. The method of measuring latency according to claim 14, further comprising:
- displaying a visible element on the multi-function display device based on receiving the indication of the event at the multi-function display device.

16. The method of measuring latency according to claim 15, wherein the displaying the visible element further comprises one of:
- displaying the visible element on a graphical image display device that graphically outputs display images based input received at the electronics system;
- displaying the visible element on a warning/caution/advisory (WCA) indicator that is activated based input received at the electronics system; or
- displaying the visible element on an artificial horizon display that corresponds to input received at the electronics system.

17. The method of measuring latency according to claim 10, wherein the processing the series of images further comprises:
- detecting a threshold within the representation of the change of state of the zero-latency indicator and a threshold within the representation the indication of the event;
- creating a plurality of binary waveforms based on detecting the threshold within the representation of the zero-latency indicator and a threshold within the representation of the indication of the event;
- detecting edges for each of the plurality of binary waveforms that measure one of rising and falling; and
- measuring a delta time between the zero-latency indicator and the representation of the indication of the event based on the detected edges for each of the plurality of binary waveforms.

18. The method of measuring latency according to claim 10, wherein determining the time difference further comprises:
- determining the difference in a rate of angular change between the indication of the event and a rate of angular change of a representation of the zero-latency indicator.

19. A method for measuring latency in electronic equipment, comprising:
- generating pulsed source signals at a sensor aperture and at a multi-functional display;
- capturing a source illumination and multi-functional display illumination directly and through a sensor path using a high frame rate camera;
- isolating a plurality of regions of interest for the source illumination and the multi-functional display illumination in video captured by the high frame rate camera;
- detecting peak thresholds in the regions of interest;
- creating a plurality of binary waveforms based on the detected peak thresholds;
- detecting a plurality of edges of the binary waveform measuring one of rising or falling; and
- measuring a delta time between the source and the multi-functional display edges providing a latency measurement.

20. The method of claim 19, further comprising:
- generating the source illumination by emitting an electromagnetic radiation emission based on receiving the generated pulsed source signals; and generating the multi-functional display illumination by receiving an event signal based on the generated pulsed source signals.

* * * * *